US012790197B1

(12) United States Patent
Bhandari

(10) Patent No.: US 12,790,197 B1
(45) Date of Patent: Nov. 10, 2026

(54) IN EAR MICRO-SPEAKER AND SENSOR SYSTEM

(71) Applicant: Vibrant Microsystems Inc., Cupertino, CA (US)

(72) Inventor: Sanjay Bhandari, Cupertino, CA (US)

(73) Assignee: Vibrant Microsystems Inc., Cupertino, CA (US)

( * ) Notice: Subject to any disclaimer, the term of this patent is extended or adjusted under 35 U.S.C. 154(b) by 662 days.

(21) Appl. No.: 18/334,992

(22) Filed: Jun. 14, 2023

Related U.S. Application Data

(60) Provisional application No. 63/352,921, filed on Jun. 16, 2022.

(51) Int. Cl.
*B81B 3/00* (2006.01)
*H04R 1/10* (2026.01)
*H04R 19/00* (2006.01)
*H04R 25/00* (2006.01)

(52) U.S. Cl.
CPC ......... *B81B 3/0021* (2013.01); *H04R 1/1016* (2013.01); *H04R 19/005* (2013.01); *B81B 2201/0257* (2013.01); *B81B 2203/0118* (2013.01); *B81B 2203/0127* (2013.01); *B81B 2203/0163* (2013.01); *B81B 2203/0315* (2013.01); *B81B 2203/04* (2013.01); *B81B 2207/015* (2013.01); *H04R 25/604* (2013.01); *H04R 2201/003* (2013.01)

(58) Field of Classification Search
CPC .......... B81B 3/0021; B81B 2201/0257; B81B 2203/0118; B81B 2203/0127; H04R 1/1016; H04R 25/604
USPC ...................................... 381/71.1, 73.1, 94.1
See application file for complete search history.

(56) References Cited

U.S. PATENT DOCUMENTS

| | | | | |
|---|---|---|---|---|
| 11,930,321 | B1 * | 3/2024 | Nasiri | H04R 7/18 |
| 2002/0191802 | A1 * | 12/2002 | Choe | H04R 23/00 381/92 |
| 2017/0347174 | A1 * | 11/2017 | Chandrasekaran | B81B 7/02 |
| 2018/0352338 | A1 * | 12/2018 | Murarka | H04R 19/005 |
| 2024/0092629 | A1 * | 3/2024 | Nasiri | B81B 7/02 |

* cited by examiner

*Primary Examiner* — Thjuan K Addy
(74) *Attorney, Agent, or Firm* — Ogawa P.C.

(57) ABSTRACT

An in-ear audio device includes a housing having an exterior region and an interior region such that the exterior region is insertable within an ear cavity. The device may include a system and a micro speaker device on a monolithic integrated circuit chip device disposed within the interior region of the housing. The micro speaker device comprises a movable diaphragm including a silicon material and characterized by a thickness, one or more sensor devices, and an electrode device operably coupled to the movable diaphragm, wherein an electrostatic force is configured to be established between the electrode device and the movable diaphragm to displace the movable diaphragm and thereby generate an audio signal.

38 Claims, 7 Drawing Sheets

Conventional earbud

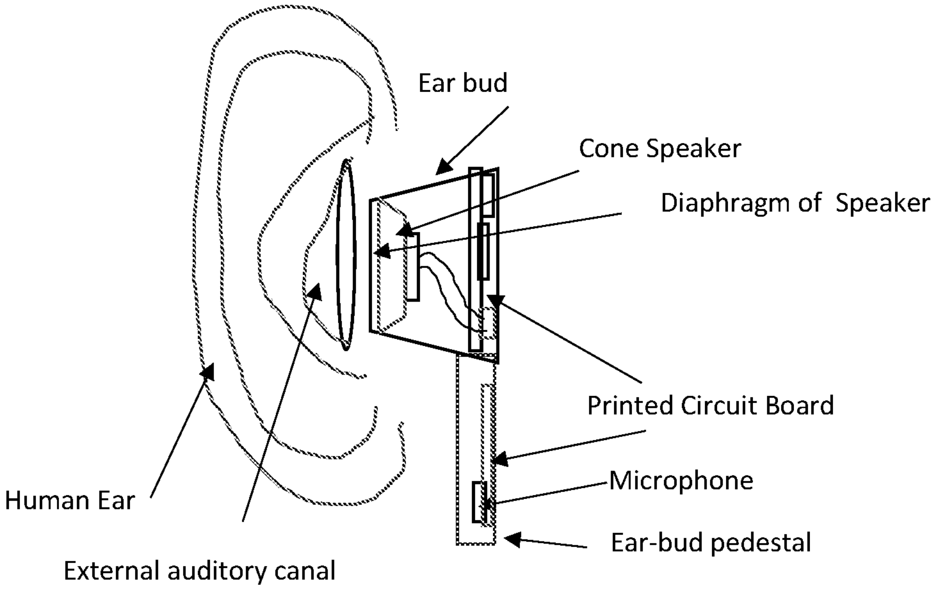
Figure 1. Conventional earbud
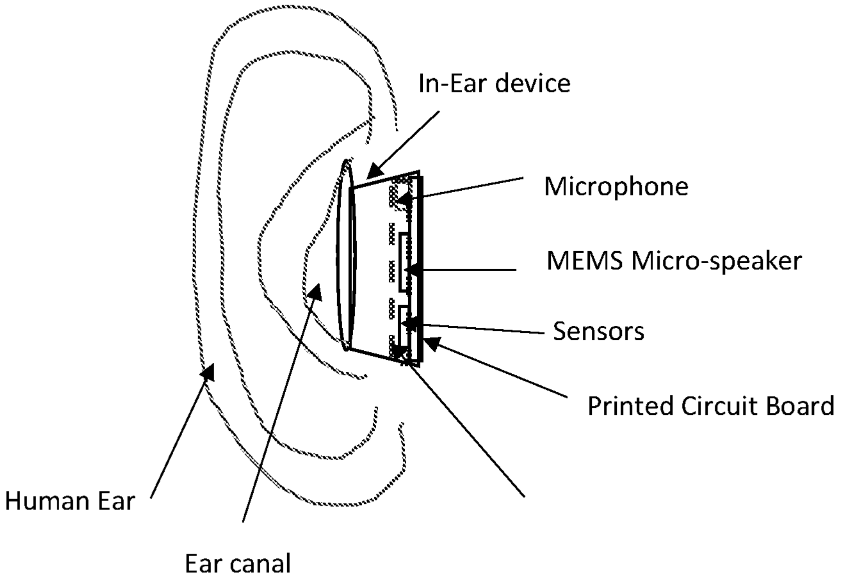
Figure 2. In-Ear device with Micro-speaker integrated System on a Chip

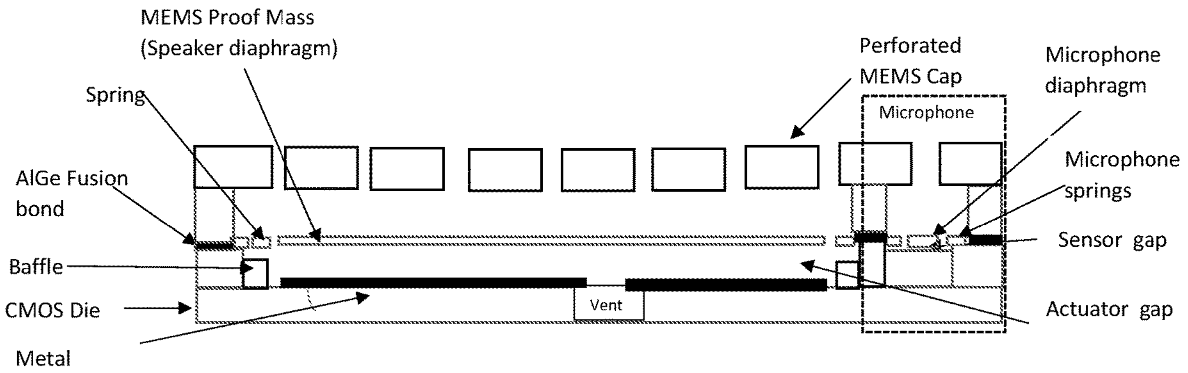
Figure 3. Speaker element integrated with CMOS and Microphone or other sensors
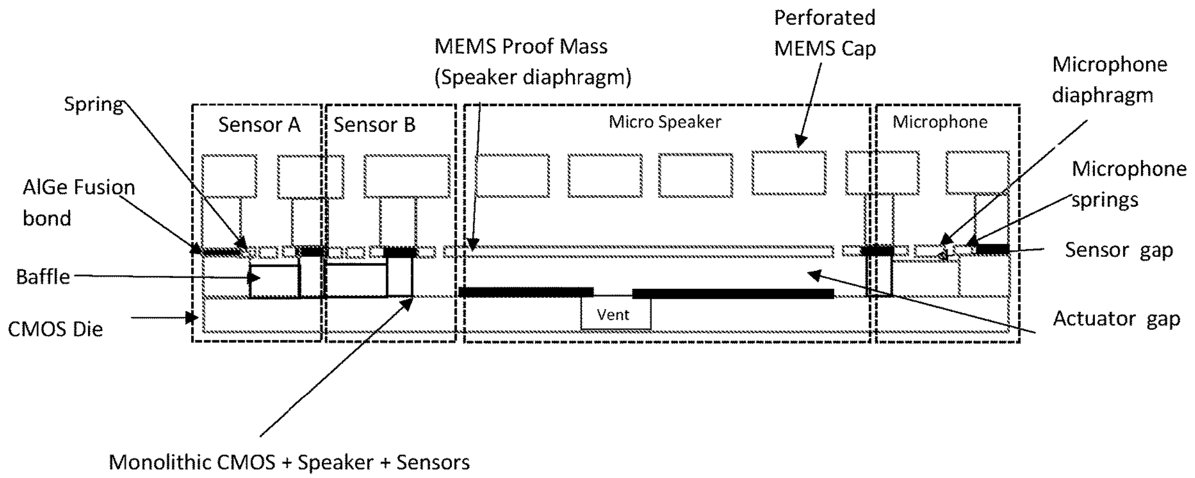
Figure 4. Speaker element integrated with Multiple other sensors

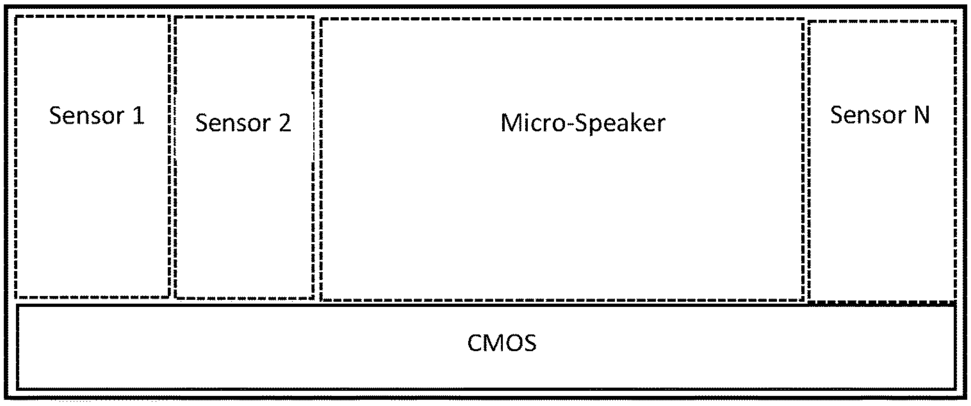
Figure 5. Monolithic structure of CMOS plus Speaker plus multiple sensors
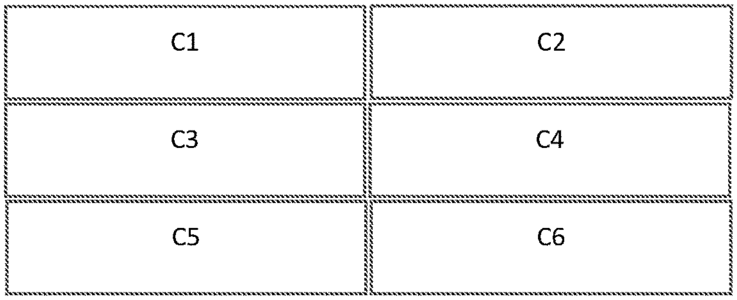
Figure 6. Micro-speaker and sensor Array with each cell optimized with different response and function
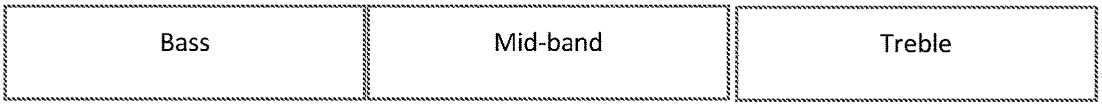
Figure 7. Micro-speaker Array acoustic equalizer

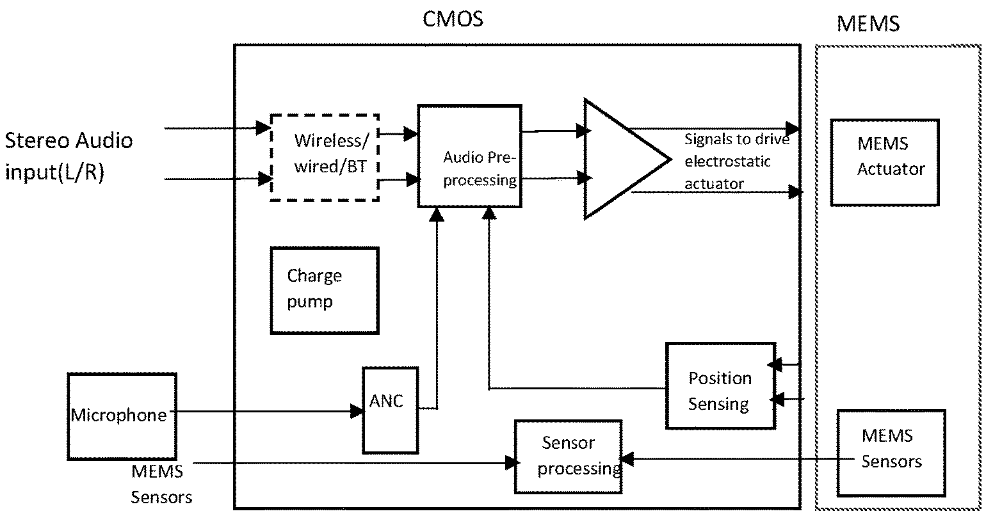
Figure 8. System on-chip with ANC, wireless or wired audio & Micro-speaker
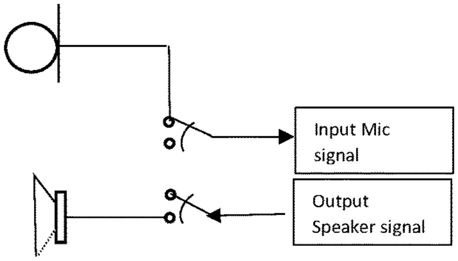
Figure 9. Time-Multiplexing Speaker & Microphone signals
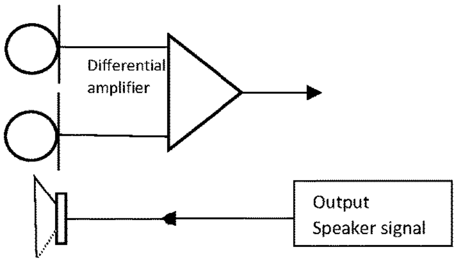
Figure 10. Processing microphone signal differentially to reduce effect from the speaker

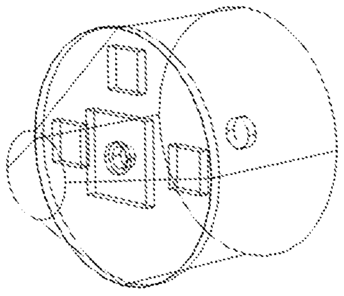
Figure 11. In-ear device with system on a chip with Micro-speaker
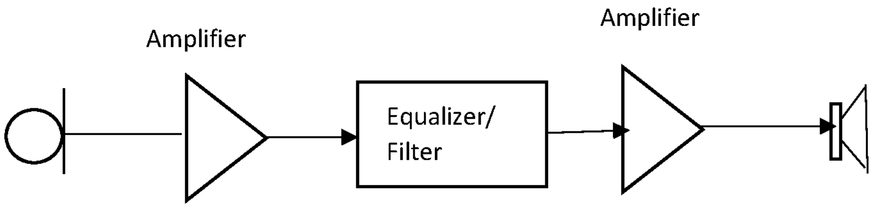
Figure 12. Personal hearing assistant System on a chip with analog implementation
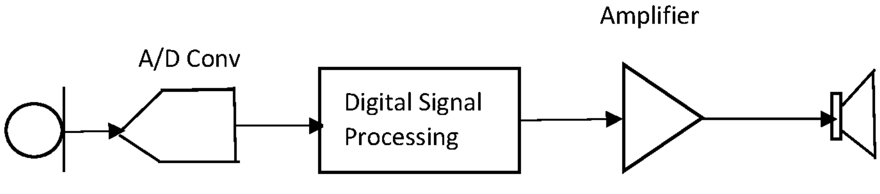
Figure 13. Personal hearing assistant Digital System on a chip

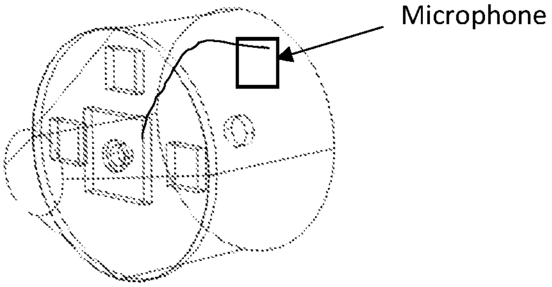
Figure 14. Alternative embodiment of In-ear device with Micro-speaker and external microphone
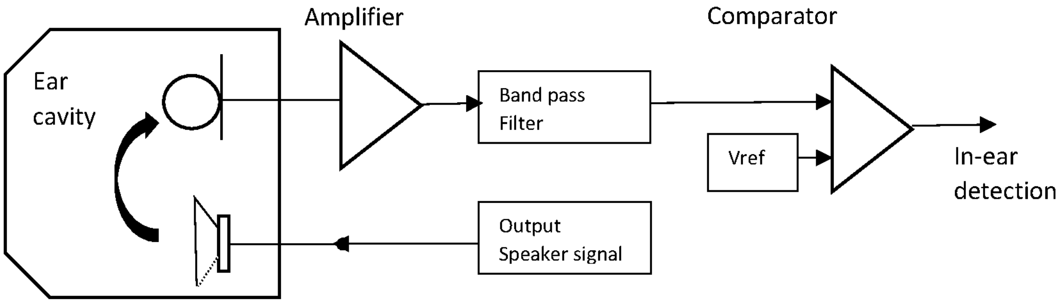
Figure 15. Mechanism to detect earbud in ear

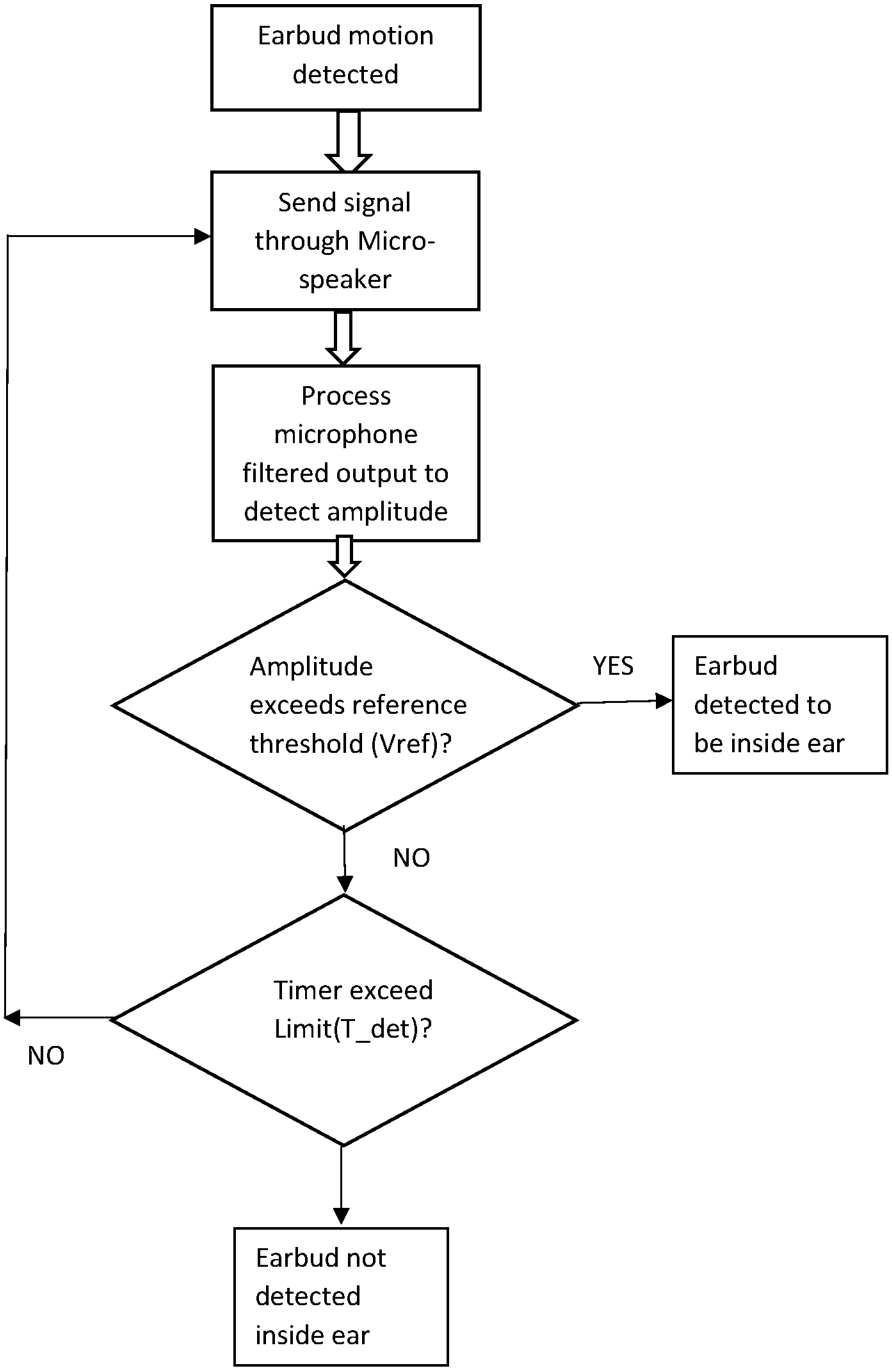
Figure 16. Example of a flow chart to detect earbud in ear

IN EAR MICRO-SPEAKER AND SENSOR SYSTEM

CROSS REFERENCE TO RELATED CASES

The present application is a non-provisional of and claims priority to U.S. Pat. App. No. 63/352,921 filed Jun. 16, 2022. That application is incorporated by reference herein for all purposes.

BACKGROUND

The present invention is directed to micro electro-mechanical systems, commonly termed "MEMS", configured as an in-ear speaker device. In particular, the present invention provides a MEMS speaker device and related methods, including MEMS actuator devices. Although the invention has been described in terms of specific examples, it will be recognized that the invention has a much broader range of applicability.

In-ear speaker devices commonly called as ear-buds, true-wireless stereo (TWS) ear buds, hearables, air pods, and the like have become popular in recent times. Common components used in these devices include a speaker, an audio processing integrated circuits (IC) such as amplifiers, coder decoders (Codec), wireless chips such as Bluetooth™ devices, and micro-controller (MCU) or processors.

The speaker, also referred to as a driver, or receiver, is a key element of the in-ear devices in terms of audio output, quality, and size of the speaker, which determine the size of the in-ear device. The terminology, based on the size of the speaker, typically refers speakers with greater than 4-inch diameter as loud speakers, 2-4 inch diameter as mini speakers, and less than 2 inch diameter as micro speakers. Most recently, ear buds have further pushed the size of the speakers to less than 1-inch diameter. Conventional speakers are commonly designed with conventional technologies that came out of the cone speaker, with a thin moving diaphragm made of paper or plastic or similar material, driven by a spring element which is actuated by electromagnetic signals proportional to the audio signal input to the speaker. The conventional speaker often includes a permanent magnet to generate a magnetic field in which a moving coil driven by electromagnetic force is operated. Assembly of the conventional speaker elements is often mechanical and cumbersome.

Other limitations exist with conventional speakers. For example, conventional speakers such as ear buds have no room for additional components facing the ear drum since the entire surface facing ear canal is occupied by the speaker cone. These and other limitations exist with conventional speaker devices for ear buds.

SUMMARY OF INVENTION

According to the present invention, techniques directed to micro electro-mechanical systems, commonly termed "MEMS", configured as an in ear speaker device are provided. In particular, the present invention provides a MEMS speaker device and related methods, including MEMS actuator devices. More particularly, the present invention provides an in-ear device using a MEMS System on a chip (SoC) micro-speaker and sensor for implementing hearable functions and other advanced features.

In an example, the invention provides an in-ear device and related structures for designing, implementing, and fabricating an ear bud with a MEMS speaker, other MEMS actuators, and sensors integrated with CMOS processing in a small form factor such that the sensors and the speaker can fit into and face in a direction directly adjacent to and facing the ear canal to efficiently monitor human body vital signs as well as implement advanced processing such as active noise cancelation (ANC). Although the invention has been described in terms of specific examples, it will be recognized that the invention has a much broader range of applicability.

In an example, the present invention provides an in-ear audio device. The device has a housing having an exterior region and an interior region such that the exterior region is insertable within an ear cavity. The device has a system on a monolithic integrated circuit chip device configured within the interior region of the housing and a micro speaker device configured on the monolithic integrated circuit chip device and the interior region of the housing. The micro speaker device comprises a movable diaphragm made of a thickness of silicon or graphene material to create a plurality of audio frequencies, one or more sensor devices, and an electrode device operably coupled to the movable diaphragm to provide electro static energy to actuate the movable diaphragm to generate an audio signal.

Depending upon the example, the present invention can achieve one or more of these benefits and/or advantages. In an example, the present invention also significantly reduces the size and profile height of the speaker combined with the rest of the electronics without affecting the performance, can integrate the CMOS audio processing within a monolithic element together with MEMS, also integrating sensors, thereby miniaturizing the whole audio chain for demanding components such as ear buds, hearables, and hearing aids. The present invention offers advantage of size weight and cost reduction for in-ear devices. Several sensor functions can also be integrated within the same device to enable enhanced vital sign monitoring in human ear in addition to complete system on a chip for earbud and similar applications.

Additionally, the present invention enables in-ear hearing aids by reducing size of the speaker (receiver) to fit in to external auditory canal, the microphone embedded as part of the speaker to measure the volume of the audio signal in the ear thereby doing active control of the sound level inside the ear, the microphone also enables feedback for noise cancellation. The composition of the speaker with multiple programmable sub-cells allows the frequency response of the speaker custom optimized, at very low cost, for an user of the device with this invention.

Furthermore, the present invention provides a MEMS Micro-speaker that can reduce the size and profile height of the speaker without affecting the performance. In an example, the present invention can integrate the CMOS audio processing within a monolithic element together with MEMS, thereby miniaturizing the whole audio chain for demanding components such as ear buds, hearables, smartwatches and smart phones. In an example, the present invention can be implemented using conventional semiconductor and MEMS process technologies for wide scale commercialization. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is an illustration of a conventional earbud device in which the speaker diaphragm is typically 8-10 mm diameter or larger and occupies all the portion of the earbud facing ear canal.

FIG. 2 is a simplified diagram that shows an in-ear device according to the present invention.

FIG. 3 is a simplified diagram of an integrated MEMS micro-speaker which monolithically integrates CMOS audio processing and sensors such as microphones to fit in an ear cavity whereby both the speaker and sensors are facing the ear canal according to an example of the present invention.

FIG. 4 is a simplified diagram illustrating additional sensors such as accelerometers, pressure sensor and temperature sensor according to an example of the present.

FIG. 5 is a simplified diagram of a structure used in the in-ear device of the current invention where multiple sensor elements Sensor A, Sensor B, and other sensors, microphone and other elements are combined with separated cavities together with the speaker on a CMOS layer according to an example of the present invention.

FIG. 6 is a simplified diagram of a speaker array where multiple such speakers cells are placed next to each other according to an example of the present invention.

FIG. 7 is a simplified diagram that shows how multiple speaker cells can also be adjusted (or optimized) to create an audio 'equalizer' according to an example of the present invention.

FIG. 8 is a simplified diagram illustrating a CMOS ASIC that is monolithically integrated with the micro speaker device according to an example of the present invention.

FIG. 9 is a simplified diagram illustrating a microphone and speaker device configured in a time multiplexed manner to mitigate the impact of the audio waves generated by the speaker from impacting the microphone when the microphone is expected to pick up external noise according to an example of the present invention.

FIG. 10 is a simplified diagram illustrating two or more microphones are used to differentially process the external noise signal according to an example of the present invention.

FIG. 11 is a simplified diagram of an in-ear device including a housing according to an example of the present invention.

FIG. 12 is a Personal Hearing Assistance System with analog implementation.

FIG. 13 is a Personal Hearing Assistance System with processing in digital domain.

FIG. 14 is an alternative embodiment to hearing aid, hearing amplifier or Personal Hearing Assistance System with a microphone facing outside the ear canal.

FIG. 15 is a simplified diagram of detecting when an earbud is in-ear.

FIG. 16 is a flow chart of an example of embodiment of automatically detecting when ear bud is inserted in the ear.

DETAILED DESCRIPTION OF THE EXAMPLES

FIG. 1 is an illustration of a conventional earbud device in which the speaker diaphragm is typically 8-10 mm diameter or larger and occupies all the portion of the earbud facing ear canal. Any electronics such as processor, audio drivers, and other elements are crammed in the space behind the speaker. In the earbuds that provide the Active Noise Cancellation (ANC) function, the microphones are not facing the ear canal. The microphones are located in the back of the earbud (behind the speaker) or in the pedestal.

FIG. 2 is a simplified diagram that shows an in-ear device according to the present invention. The device has a small form factor MEMS Micro-speaker system is implemented on a single chip with both CMOS and MEMS co-located on the monolithic chip. The CMOS die forms the bottom layer of the micro-speaker. The CMOS die will have all the electronics for processing of the audio signal, actuation of the MEMS, sensing of the MEMS movement, electronic damping, ANC, and other circuits. The CMOS may also integrate functionality required for wireless communication such as Bluetooth™ communication to receive the audio signal from a processor, a smartphone, or any other device. In addition, the CMOS and MEMS may integrate additional sensors to sense the MEMS motion and also to sense acceleration, pressure or temperature.

An example of the present invention is used in the hearing aid. In an example, the small feature size of the speaker (also called receiver), allows fit of the hearing aid in the ear canal and make it invisible. Multiple speaker cells of the speaker will allow frequency response fine tuning customized to the requirement of the user or to compensate the hearing loss. A microphone co-located with the speaker, measures the sound intensity inside the ear to allow active and automated control of the volume. The microphone in the ear canal also measures noise inside ear canal and implements the ANC function for the hearing aid device.

FIG. 3 is a simplified diagram of an integrated MEMS micro-speaker which monolithically integrates CMOS audio processing and sensors such as microphones to fit in an ear cavity whereby both the speaker and sensors are facing the ear canal according to an example of the present invention.

The CMOS will have one or multiple metal layers. Part of the top metal layer will be used as electrostatic actuator. The metal actuator will be driven by an electrical signal that may have DC as well as AC components. Voltage of the actuator generates an electrostatic force on the MEMS layer above the actuation area.

The cap wafer is a silicon wafer with cavity in the center area to allow movement of the diaphragm.

The periphery of the cap wafer die will have aluminum-germanium or similar deposition to allow bonding with the CMOS wafer.

The cap wafer may have silicon on insulator (SOI) if the outer surface needs to be isolated from the audio voltage. The cap wafer may have additional metal, poly or other electrically conductive deposition on its inner surface facing the diaphragm forming an electrode layer that operates as an actuation layer from the cap.

The cap wafer or the conductive surface deposited on the cap wafer will be connected electrically and driven by a signal proportional to the audio signal. The cap wafer will have perforation or holes in order to allow air pressure or sound waves to pass freely through it. The size of the holes will be a tradeoff between resistance to the air flow versus protecting the cavity from any particles from the atmosphere where the speaker is exposed. In place of through holes, there may be maze of airway paths so that audio waves can pass through them but particles from outer environment will have stronger barrier to reach to the speaker cavity.

The MEMS layer is shown as multiple elements in FIG. 3. The MEMS layer has a diaphragm or piston designed to have up & down motion (towards & away from the CMOS actuator metal). The diaphragm is connected to the frame or anchor by using MEMS springs, beams, or lever. The springs may have cantilever action and or torsional force or a combination of the both forces. The MEMS region directly above the metal actuator electrode will move vertically due to the electrostatic force. This force will attract the MEMS actuator, pulling it closer to the metal surface. The spring also helps in restoring the diaphragm to its original position where there is minimal tension in the spring. There is a gap between moving MEMS element in the actuation area and the metal actuation layer. A smaller gap would exert more electrostatic force than a larger gap. The actuator gap is designed based on the desired movement of the MEMS, the desired electrostatic force, and damping forces.

The MEMS diaphragm in the speaker area may also be connected with certain voltage. This voltage is designed such that the electrostatic forces are maximized.

With an electrostatic force applied from the metal plate on CMOS, the MEMS region in the actuation area will be electrostatically attracted toward the metal plate, thereby pulling it down if the force is attractive. This movement will create cantilever force in the spring which causes the spring to move downwards. When the electrostatic force from the metal actuator ceases to exist, the diaphragm will move up.

In this example, the cap wafer or its inner surface layer such as metal, may be driven by a voltage proportional to the audio voltage driving the speaker. If driven and assuming same gap the motion of the diaphragm is doubled. In one embodiment of the invention, the cap wafer can be Silicon on Insulator where the outer surface is not connected to any potential (or signal) but the SOI silicon is driven by a signal. In another embodiment, the cap wafer will have metal actuation layer which will be driven by a voltage to attract the diaphragm towards the cap. The cap wafer will create electrostatic force similar to the actuation layer on the CMOS but opposite in phase depending on the electrical signal applied to the electrodes on the bottom & top.

The vertical up and down movement of the diaphragm is proportional to the audio signal applied to the MEMS speaker cell. The up & down motion pushes air thereby creating sound waves.

The diaphragm can be made of a suitable material such as silicon, graphene or a combination of different material. Vertical motion of the diaphragm pushes air up or away from the diaphragm. The motion of the diaphragm and the pressure it transmits to the outer environment is proportional to the audio input, thereby acting as a speaker.

The baffles prevent back air pressure from mixing with the front air waves.

The top of the cap may have additional protective material as a barrier to the electrical conductivity, humidity, moisture, or dust particles but allow audio waves to pass through.

The spring constant and the area and mass of the diaphragm can be designed to obtain the resonance of the MEMS at a desired frequency. At the resonant frequency, the movement of the diaphragm will be maximum. On the other hand, the dimensions and mass can be adjusted or optimized to obtain a flatter frequency response for a desired frequency bandwidth.

In an example, the CMOS may have a vent hole or holes or openings to allow air movement created by the diaphragm.

FIG. 3 is a simplified diagram that shows a structure that provides integrated microphone function according to an example of the present invention. The microphone area has a diaphragm that has smaller gap to the sensing metal layer below it. The microphone layer will have independent spring, diaphragm optimization. In an example, the microphone region may be physically isolated from the speaker portion in order to avoid interference between the two functions. In another example, multiple microphones may be implemented to provide differential processing of the signal to eliminate the signal of the speaker or other disturbances such as noise and or vibrations due to walking motion which becomes common mode to the two microphones.

The microphone in the integrated structure can be used for active noise cancellation function. Two or more microphones help in isolating noise due to the phase difference of external noises reaching to these microphones and providing feedback signal to cancel the noise. Using two or more microphones can help in identifying and isolating the signal of interest (the audio signal from the speaker itself) from the noise due to the phase difference in the two signals.

FIG. 4 is a simplified diagram illustrating additional sensors such as accelerometers, pressure sensor and temperature sensor according to an example of the present. Each of them will use a MEMS layer but optimized diaphragm thickness and gap to the CMOS metal layer.

In an example t, the speaker and microphone cavities are separated. This is achieved by creating two cavities in the cap wafer before it is fusion bonded. Then one cavity is used for speaker and the other cavity is used for the microphone(s). This isolates the laterally traveling sounds waves from the speaker directly affecting microphone. Microphone cavity opening can be separately brought out, for example through a hole in the ear bud that opens up outside to sample external noise sources and not the sound from the speaker.

FIG. 5 is a simplified diagram of a structure used in the in-ear device of the current invention where multiple sensor elements Sensor A, Sensor B, and other sensors, microphone and other elements are combined with separated cavities together with the speaker on a CMOS layer according to an example of the present invention. The sensors can, for example, be an accelerometer, a pressure sensor, a temperature sensor, among others.

In the present invention, the micro-speaker may include multiple speaker cells, with each cell optimized (or adjusted) to achieve a certain desired resonance frequency.

FIG. 6 is a simplified diagram of a speaker array where multiple such speakers cells are placed next to each other according to an example of the present invention. For example, a speaker cell C1 in FIG. 6 may have a resonance frequency at frequency F1, cell C2 at frequency F2 and so on. The resultant frequency response of the combined system can be optimized or adjusted to achieve an overall wide band frequency response or have a boost in the band of interest. Also by phase array activation of the speaker the sound maximum can be at different points in the ear.

For an example of the present invention with hearing aid, the cell array can be tuned customized to an user to compensate for the hearing requirement.

FIG. 7 is a simplified diagram that shows how multiple speaker cells can also be adjusted (or optimized) to create an audio 'equalizer' according to an example of the present invention. Each cell or multiple cells can be optimized to cover bass, mid-band, and Treble frequency responses. A user can then adjust the equalizer to a desired setting that is favorable to the user.

FIG. 8 is a simplified diagram illustrating a CMOS ASIC that is monolithically integrated with the micro speaker device according to an example of the present invention. The ASIC will have audio pre-processing. The pre-processing will optimize the signal fed to the actuator in order to pre-compensate for non-linearity of the MEMS, pre-distortion and pre-equalization to compensate for the MEMS effects. The pre-processing can also generate signals for micro-speaker equalizer as shown above. In addition, since there are multiple speaker cells in the array, a 'depth of sound' or 'directionality' effect can also be generated by pre-processing the audio in ASIC. The CMOS ASIC can integrate functionality of wireless communication such as Bluetooth. It can also integrate functionality of Active Noise Cancellation (ANC) for an in-ear device. The microphones used for ANC function may or may not be integrated on the same die as the micro-speaker.

FIG. 9 is a simplified diagram illustrating a microphone and speaker device configured in a time multiplexed manner to mitigate the impact of the audio waves generated by the speaker from impacting the microphone when the microphone is expected to pick up external noise according to an example of the present invention. In this example, when the microphone is operated, the audio is at the relatively quiet period. This, for example, can be when the external noise is sampled by the structure to set the active noise cancellation before the speaker starts producing sound waves. Alternatively, the microphone can capture its data during each start-up or power ON of the speaker system and periodically after that. In yet another example, the 'switch' shown in FIG. 8, can also be a mechanical switch whereby microphone is activated by physically closing the cavity of the speaker and vice versa.

FIG. 10 is a simplified diagram illustrating two or more microphones are used to differentially process the external noise signal according to an example of the present invention. In this case, the audio signal from the speaker appears as a common mode signal and can be effectively isolated from the noise signal. The multiple microphones differentiate an external noisy sound based on the phase difference based on the spacing between the two microphones, the distance from external source to each of the microphones and the speed of the sound.

FIG. 11 is a simplified diagram of an in ear device including a housing according to an example of the present invention. The in-ear device has dimensions to ideally fit in the ear cavity with an opening facing ear canal. The integrated micro-speaker has its vent directed towards the opening of the housing towards ear canal. This allows the micro-speaker sound waves to be directed toward the ear canal cavity. One or more sensors integrated inside the micro-speaker system on a chip will also be facing directly toward the ear cavity allowing optimal sensing of vital sign parameters such as body temperature etc. Additional sensors and other auxiliary components can be mounted in the space on the PCB where the micro-speaker is assembled. The in-ear device will have a cylindrical back volume and vent.

FIG. 12 is a simplified diagram of the Personal Hearing Assistance Device implemented using the current invention. A microphone in the 'in-ear device', integrated within the device, captures the audio signal and voice reaching the microphone. The audio signal is then amplified with on chip amplifier. The signals are processed with signal processor including filters to improve the signal to noise ration and voice quality. The amplified signal is fed to the micro-speaker. Being closer to the ear diaphragm, the fidelity of the voice reaching to the ear diaphragm of the user is improved. With the current invention, the 'in-ear device' can become very small so that it completely fits inside human ear canal which is on average 6 mm diameter.

FIG. 13 shows a simplified example of Personal Hearing Assistance Device implemented using the current invention with certain signal processing implemented in digital. In this implementation, the signal received at the microphone is first converted to digital using a on chip Analog to Digital Converter (A/D). The digitized signal is then processed in digital signal processor including digital filters to improve SNR. The digital signal can be fed to the micro-speaker of the system to achieve improved signal quality.

The Personal Hearing assistance devices in both the approaches shown in FIGS. 12 and 13 will have programmable gain to appropriately make us for the hearing loss or hearing requirement of the user.

FIG. 14 shows example 'in ear device' where the microphone mounted outside the micro-speaker chip. In such an implementation, there is more flexibility of mounting the microphone pointing to outside the ear canal to capture external audio and voice signal.

FIG. 15 shows example of how the 'in ear device' can implement automatic detection of when the device is inserted in the ear. Conventional methods use optical sensors to implement the detection of the in-ear insertion. In the approach as per current invention, an audio signal such as a single tone, single audio frequency or multiple audio frequencies, above the listening range, for example, above 20 KHz frequency is emitted through the micro-speaker. The amplitude of the signal transmitted is designed to be an amplitude lower than, for example, 40 dB SPL. Human ear will not be able to detect such a frequency tone. However, the on-chip microphone that is integrated with the micro-speaker can capture such a tone if both the micro-speaker and the microphone are enclosed in a small cavity, which in this case will be ear canal cavity between the in-ear device and the ear diaphragm. If the same frequency tone, with the same amplitude is played in an open air, outside ear cavity, the signal captured by the microphone will be very small. The captured signal is compared with a reference threshold. If the captured signal from the microphone is above certain amplitude, then the system considers that the device is inserted in the ear.

FIG. 16 shows an example flow chart of how the in-ear detection system can be operated optimally. An on chip device, such as for example an Accelerometer, detects when the in-ear device is moved. This movement, for example, can be when an user is inserting the in-ear device in his/her ear. However, the movement may also be due to other reasons. After the 'motion' is detected, the micro-speaker is activated to play certain frequency tones. The tones can be one or more and can be of varying amplitude and frequencies to make the in-ear detection robust. Only when the device is inserted in the ear canal, the microphone will capture signal amplitude greater than the reference threshold 'V_Ref'. The frequency tones are played for a limited time duration defined by time 'T_det'. If the 'in-ear device' system does not detect the frequency tones during the time T_det, then the system stops sending any more pulses through the micro-speaker.

The signals received during the time duration 'T_det' may be processed through an on-chip analog or digital or neural network processor to come up with a final determination that the device is inserted in the ear or not.

In an example, the present invention provides an in-ear audio device. The device has a housing having an exterior region configured to be positioned within an ear opening of a human user and an interior region. The device has a MEMS micro-speaker device configured within the inner region of the housing. The MEMS micro-speaker device comprises one or more micro-speaker cells, each of the micro-speaker cells having a same or different resonance frequency. In an example, each of the micro speaker cells comprises a movable diaphragm device made of a thickness of silicon or other suitable material and configured as an actuator device to push and pull air to generate a sound pressure in the ear opening and a CMOS integrated circuit chip integrated with the movable diaphragm device.

In an example, the device is an ear-bud. In an example, the device is configured as a hearing aid. In an example, the device is configured as a hearable.

In an example, the device comprises a sensing device coupled to the CMOS integrated circuit chip and having a sensing region facing an interior of an ear channel of the ear opening and/or a sensing device coupled to the CMOS integrated circuit and having a sensing region facing away from an ear channel of the ear opening.

In an example, the CMOS integrated circuit comprises an active noise cancellation circuit. In an example, the CMOS integrated circuit comprises an active noise cancellation circuit coupled to a microphone sensor device configured with the in-ear device. In an example, the CMOS integrated circuit comprises an active noise cancellation circuit coupled to an external microphone sensor device configured with the in-ear device. In an example, the CMOS integrated circuit comprises a Bluetooth™ communication module for a wireless communication signal. In an example, the CMOS integrated circuit is configured to output a depth of sound effect generated using a pre-processing module using a frequency information, an amplitude information, and a phase information. In an example, the CMOS integrated circuit comprises a programmable module to be adjusted for an individual user. In an example, the CMOS integrated circuit is a single CMOS ASIC integrated with the multiple micro-speaker cells.

In an example, the in-ear device is configured with a frequency response that is modified by adjusting a dimension of a spring and a mass of the diaphragm to achieve a resonance at a desired frequency. In an example, one or more micro speaker cells are configured to create a frequency response with a desired bandwidth and a performance. In an example, one or more micro speaker cells are configured to create a frequency boost at a desired single or multiple bands of frequencies. In an example, one or more micro speaker cells are configured to create an audio equalizer with a user defined bass frequency, a mid-band frequency, and a treble frequency or for a finer granular control across an audio frequency band like a music equalizer.

In an example, the device has one or more openings on a plate over the movable diaphragm device such that the one or more openings are configured to damp undesired resonance. In an example, the micro speaker-cells are configured with at different phases to shape a sound signal to a user. In an example, the device is configured to compensate an audio signal for hearing loss by adjusting the frequency response configured for a user.

In an example, the present invention provides an alternative in-ear audio device. The device has a housing having an exterior region and an interior region, the housing having a length of no greater than an amount to enter the ear channel and a width of no greater than a suitable dimension to hold the housing in place in the ear channel. In an example, the device has a system on a monolithic integrated circuit chip device configured within the interior region of the housing. The device has a micro speaker device configured on the monolithic integrated circuit chip device and the interior region of the housing. In an example, the micro speaker device comprises a movable diaphragm made of a thickness of silicon material to create a plurality of audio frequencies, one or more sensor devices, and an electrode device operably coupled to the movable diaphragm to provide electro static energy to actuate the movable diaphragm to generate an audio signal.

In an example, the one or more sensors comprises a microphone, an accelerometer, a pressure sensor, a temperature sensor, among others. These and other details of the present invention can be found throughout the present specification.

Further details of the micro-speaker device are described in more detail and in particular as follows. In an example, the present invention provides a micro-speaker device. The device has a cap device comprising a plurality of vent regions for propagating acoustic signals. The cap device can be made of a suitable material such as silicon, or other rigid substrate capable of being processed. In an example, the device has a CMOS device coupled to the cap device. In an example, the CMOS device comprises at least one vent region configured to allow backpressure to flow therethrough. The CMOS device can be a CMOS semiconductor substrate, including a plurality of CMOS cells. The device has a cavity region configured between a cap interior surface of the cap device and a CMOS device interior surface of the CMOS device. The device has a frame device coupled between the cap device and the CMOS device to form an exterior housing for the cavity region. An example, the frame device can be configured on either or both of the cap device and/or the CMOS device.

In an example, the device has a movable diaphragm device comprising a thickness of silicon or graphene material having a thickness 0.1 nm to ten microns, and configured spatially in an elongated manner within the cavity region. In an example, the movable diaphragm device has a first surface and a second surface opposite of the first surface. In an example, the movable diaphragm is connected with at least two cantilever or springs. Each of the cantilever or springs being coupled between a peripheral region of the movable diagram device and a portion of a frame configured surrounding the movable diaphragm device.

In an example, the device has a CMOS electrode device configured on the CMOS device interior region. That is, the CMOS device has an electrode device or devices formed on an interior region of the CMOS device.

In an example, the device has a cap electrode device configured on the cap interior surface, whereupon each of the cap electrode device and the CMOS electrode device is operable to electrostatically move the movable diaphragm using a pull action to cause movement of the diaphragm in response to the applied electrical signals and to cause movement of the diaphragm in response to the applied electrical signals and cause propagation of acoustic signals from one or more of the plurality of vent regions in the cap device.

In an example, the electrodes produce an electrostatic force to move the movable diaphragm device from a first spatial region to a second spatial region within the cavity and configured in an out of plane shape concurrent with the movement.

In an example, the movable diaphragm device includes one or more peripheral regions that are free standing. In an example, the cavity region comprises a first region facing the first surface and a second region facing the second surface. In an example, the cap device comprises the plurality of vent regions configured to block particles from entering the cavity region but allow passing of sound pressure. In an example, the cap device comprises an insulating material and an overlying metal material to electrically isolate an actuation voltage from the cap device. In an example, the movable diaphragm device is connected to the frame device on each side of the movable diaphragm device.

In an example, the device is characterized by a frequency response associated with a mass of the movable diaphragm device and a spring constant of the spring to achieve resonance at a desired frequency.

In an example, the device further comprises a voltage potential configured between the cap electrode device and the movable diaphragm device to apply an electrostatic force on the movable diaphragm device. In an example, the device has one or more baffles within the cavity region to prevent one or more acoustic waves from propagating from the first surface to the second surface of the movable diaphragm device.

In an example, the device has at least one sense electrode configured on the cap device to track a position of the movable diaphragm device. In an example, the device has at least one sense electrode to detect a position of the movable diaphragm device to provide feedback to control non-ideal behavior of the movable diaphragm device. In an example, the device has at least one sense electrode to provide feedback to apply electrostatic damping on the movable diaphragm device.

In an example, each of the springs comprises one or more cuts in the diaphragm.

In an example, the present invention provides an alternative speaker device. The device has a CMOS substrate comprising a first surface region and a second surface region. The first surface region is opposite of the second surface region. In an example, the first surface region can be either the front side or backside surface and the second surface can be the backside or frontside surface.

In an example, the device has an N by M array, where N is an integer 1 and greater, and M is an integer 1 and greater, of micro speaker cells configured on the CMOS substrate. Each of the cells can be the same, different, or configured with the same or different sized cells to generate a desirable audio signal or signals. Each of micro speaker cells comprises a cap device comprising a plurality of vent regions for propagating acoustic signals, a cavity region configured between a cap interior surface of the cap device and a CMOS device interior surface of the CMOS device, and a frame device coupled between the cap device and the CMOS device to form an exterior housing for the cavity region.

Each of the cells has a movable diaphragm device comprising a thickness of silicon or graphene material having a thickness 0.1 nm to ten microns, and configured spatially in an elongated manner within the cavity region. The movable diaphragm device has a first surface and a second surface opposite of the first surface. The movable diaphragm is connected with at least two cantilever or springs. Each of the cantilever or springs is coupled between a peripheral region of the movable diagram device and a portion of a frame configured surrounding the movable diaphragm device.

Each cell has a CMOS electrode device configured on the CMOS device interior region.

Additionally, each cell has a cap electrode device configured on the cap interior surface, whereupon each of the cap electrode device and the CMOS electrode device is operable to electrostatically move the movable diaphragm using a pull action to cause propagation of acoustic signals from one or more of the plurality of vent regions in the cap device.

In an example, the array of microspeaker cells is configured to create a wider band flat frequency response. In an example, the array of micro-speaker cells is configured to move the movable diaphragm devices in a different phase to produce a desired acoustic signal. In an example, the array of microspeaker cells is configured to create a frequency boost at a desired single or multiple bands of frequencies and is configured to create an audio equalizer including a bass, mid band, and treble frequencies.

In an example the CMOS device comprises a pre-processor for processing an audio signal for output on the array of micro-speaker cells. Additionally, the device comprises a module comprising an adjustment process to be customized for an individual or individual ear for a desired sound experience. In an example, the array of cells is configured on a single CMOS substrate or a single cap region. In an example, device further comprises a single encapsulation region coupled to the one or more micro speaker cells.

In an example, the present invention provides an in-ear audio device. The device has a housing having an exterior region and an interior region, e.g., a length of no greater than 30 mm and a width of no greater than 30 mm. The device has a monolithic integrated circuit chip device configured within the interior region of the housing. The device has a micro speaker device configured with the monolithic integrated circuit chip device and the interior region of the housing. In an example, the micro speaker device comprises a movable diaphragm made of at least a thickness of silicon material to create a plurality of audio frequencies, one or more sensor devices, and an electrode device operably coupled to the movable diaphragm to provide electro static energy to actuate the movable diaphragm to generate an audio signal.

In an example, the one or more sensors comprises a microphone, an accelerometer, a pressure sensor, a temperature sensor, an optical sensor, any combination thereof, and others. In an example, the device further comprises a plurality of microphones configured with the monolithic integrated circuit to decide a direction of a sound source or a plurality of microphones configured to implement beam steering to selectively amplify an incoming sound depending on a direction of a sound source.

In an example, the invention provides an ear-bud audio device. The device has a housing having an interior region configured to be positioned within an ear opening of a human user and an outer region. The device has a MEMS micro-speaker device configured within at least the inner region of the housing. The MEMS micro-speaker device comprises one or more micro-speaker cells. Each of the micro-speaker cells has a resonance frequency. Each of the micro speaker cells comprises a movable diaphragm device made of a thickness of silicon material and configured as an actuator device to push and pull air to generate a sound pressure in the ear opening. The device has a MEMS microphone device configured to the outer region of the housing facing outside of an ear canal and a CMOS integrated circuit chip integrated with the movable diaphragm device such that the CMOS chip provides a programmable amplification and a signal processing to an audio signal captured by the MEMS microphone and fed to the MEMS micro-speaker device such that the earbud device acts as a personal hearing assistance device.

In an example, the earbud audio device is configured as an 'in-ear' device fitting inside the ear canal. In an example, the programmability of audio signal and frequency response are programmed from a smartphone device wirelessly coupled to the ear-bud audio device.

In an example, the invention has an alternative ear-bud audio device. The device has a housing having an interior region configured to be positioned within an ear opening of a human user. The device has a speaker device configured within at least the inner region of the housing facing an ear canal and a microphone device configured within the inner region of the housing facing the ear canal. The device has a driver device that drives a signal to the speaker device. The device has a processing device that processes one or more signals captured by the microphone device corresponding to a signal played by the speaker device such that the processing device detects when the earbud audio device is inserted in the ear opening.

In an example, the one or more signals are characterized by one or more audio frequencies that are frequencies above a normal hearing range of human beings. In an example, the one or more signals are characterized by audio frequencies that are multiple tones.

In an example, the device further comprising an audio tone detection based on an accelerometer device detecting movement of the earbud device or further comprising an audio tone detection operated for a programmable time duration after detection of motion of the ear bud device.

In an example, the one or more signals captured from the microphone device is filtered to band pass filter one or more frequencies corresponding to a frequency transmitted over the speaker device. In an example, the microphone device generates microphone signal data processed through a digital signal processor to decide whether the ear-bud audio device is inserted in the ear opening of the ear.

In an example, the device further comprising an analog circuit configured for an audio tone detection performed in the analog circuit to decide the ear-bud audio device is inserted in the ear opening. The device further comprises an artificial intelligence neural network configured for audio tone detection performed by processing one or more signals processed through the artificial intelligence neural network to determine where the ear-bud audio device is inserted in the ear opening.

While the above is a full description of the specific examples, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. An in-ear audio device, comprising:

a housing having an exterior region configured to be positioned within an ear opening of a human user and an interior region;

a MEMS micro-speaker device configured within at least the interior region of the housing, the MEMS micro-speaker device comprising one or more micro-speaker cells, each of the micro speaker cells comprising a movable diaphragm device comprising a thickness of silicon material and configured as an actuator device to push and pull air to generate a sound pressure in the ear opening and a CMOS integrated circuit chip integrated with the movable diaphragm device.

2. The device of claim 1 wherein the device is characterized as an ear-bud.

3. The device of claim 1 further comprising a sensing device coupled to the CMOS integrated circuit chip and having a sensing region facing an interior of an ear channel of the ear opening.

4. The device of claim 1 further comprising a sensing device coupled to the CMOS integrated circuit and having a sensing region facing towards an ear channel of the ear opening.

5. The device of claim 1 wherein the device is configured as a hearing aid for the human user.

6. The device of claim 1 wherein the CMOS integrated circuit comprises an active noise cancellation circuit.

7. The device of claim 1 wherein the CMOS integrated circuit comprises an active noise cancellation circuit coupled to a microphone sensor device configured with the in-ear device.

8. The device of claim 1 wherein the CMOS integrated circuit comprises an active noise cancellation circuit coupled to an external microphone sensor device configured with the in-ear device.

9. The device of claim 1 wherein one or more micro speaker cells are configured to create a frequency response with a desired bandwidth and a performance.

10. The device of claim 1 wherein one or more micro speaker cells are configured to create a frequency boost at a desired single or multiple bands of frequencies.

11. The device of claim 1 wherein one or more micro speaker cells are configured to create an audio equalizer with a user defined frequency response for the human user.

12. The device of claim 1 wherein the CMOS integrated circuit comprises a Bluetooth™ communication module for a wireless communication signal.

13. The device of claim 1 wherein the CMOS integrated circuit is configured to output a spatial sound effect generated using a pre-processing module using a frequency information, a spatial location of the sound information, an amplitude information, and a phase information.

14. The device of claim 1 wherein the micro speaker-cells are configured with at a plurality of different phases to shape a sound signal to the human user.

15. The device of claim 1 wherein the CMOS integrated circuit comprises a programmable module to be adjusted for an individual user.

16. The device of claim 1 wherein the CMOS integrated circuit is a single CMOS ASIC integrated with the multiple micro-speaker cells.

17. The device of claim 1 wherein the device is configured to compensate an audio signal for hearing loss by adjusting the frequency response and amplitude configured for a user.

18. A device of claim 1 further comprising a Non Volatile Memory (NVM) configured to store profile customized to the human user.

19. An in-ear audio device, the device comprises:

a housing having an exterior region and an interior region, the housing having a length of no greater than 30 mm and a width of no greater than 30 mm;

a monolithic integrated circuit chip device configured within the interior region of the housing;

a micro speaker device configured with the monolithic integrated circuit chip device and the interior region of the housing, the micro speaker device comprising:

a movable diaphragm made of at least a thickness of silicon material to create a plurality of audio frequencies;

one or more sensor devices; and an electrode device operably coupled to the movable diaphragm to provide electro static energy to actuate the movable diaphragm to generate an audio signal.

20. The device of claim 19 wherein the one or more sensors comprises a microphone.

21. The device of claim 19 wherein the one or more sensors comprises an accelerometer.

22. The device of claim 19 wherein the one or more sensors comprises a pressure sensor.

23. The device of claim 19 wherein the one or more sensors comprise a temperature sensor.

24. The device of claim 19, wherein the one or more sensors is an optical sensor.

25. A device of claim 19, further comprising a plurality of microphones configured with the monolithic integrated circuit to decide a direction of a sound source.

26. A device of claim 19, further comprising a plurality of microphones configured to implement beam steering to selectively amplify an incoming sound depending on a direction of a sound source.

27. An ear-bud audio device, comprising:

a housing having an interior region configured to be positioned within an ear opening of a human user and an outer region;

a MEMS micro-speaker device configured within at least the interior region of the housing, the MEMS micro-speaker device comprising one or more micro-speaker cells, each of the micro-speaker cells having a resonance frequency, each of the micro speaker cells comprising a movable diaphragm device made of a thickness of silicon material and configured as an actuator device to push and pull air to generate a sound pressure in the ear opening;

a MEMS microphone device configured to the outer region of the housing facing outside of an ear canal; and a CMOS integrated circuit chip integrated with the movable diaphragm device such that the CMOS chip provides a programmable amplification and a signal processing to an audio signal captured by the MEMS microphone and fed to the MEMS micro-speaker device such that the earbud device acts as a personal hearing assistance device.

28. The device of claim 27, wherein the earbud audio device is configured as an 'in-ear' device fitting inside the ear canal.

29. The device of claim 27, where the programmability of audio signal and frequency response are programmed from a smartphone device wirelessly coupled to the ear-bud audio device.

30. An ear-bud audio device, comprising:

a housing having an interior region configured to be positioned within an ear opening of a human user;

a speaker device configured within at least the interior region of the housing facing an ear canal;

a microphone device configured within the interior region of the housing facing the ear canal;

a driver device that drives a signal to the speaker device;

a processing device that processes one or more signals captured by the microphone device corresponding to a signal played by the speaker device such that the processing device detects when the earbud audio device is inserted in the ear opening.

31. The device of claim 30, wherein the one or more signals are characterized by one or more audio frequencies that are frequencies above a normal hearing range of human beings.

32. The device of claim 30, wherein the one or more signals are characterized by audio frequencies that are multiple tones.

33. The device of claim 30, further comprising an audio tone detection based on an accelerometer device detecting movement of the earbud device.

34. The device of claim 30, further comprising an audio tone detection operated for a programmable time duration after detection of motion of the ear bud device.

35. The device of claim 30, wherein the one or more signals captured from the microphone device is filtered to band pass filter one or more frequencies corresponding to a frequency transmitted over the speaker device.

36. The device of claim 30, wherein the microphone device generates microphone signal data processed through a digital signal processor to decide whether the ear-bud audio device is inserted in the ear opening of the ear.

37. The device of claim 30, further comprising an analog circuit configured for an audio tone detection performed in the analog circuit to decide the ear-bud audio device is inserted in the ear opening.

38. The device of claim 30, further comprising an artificial intelligence neural network configured for in-ear detection performed by processing one or more signals processed through the artificial intelligence neural network to determine where the ear-bud audio device is inserted in the ear opening.

* * * * *